United States Patent [19]

Stengl

[11] Patent Number: 5,113,237
[45] Date of Patent: May 12, 1992

[54] PLANAR PN-JUNCTION OF HIGH ELECTRIC STRENGTH

[75] Inventor: Reinhard Stengl, Stadtbergen, Fed. Rep. of Germany

[73] Assignee: Siemens Aktiengesellschaft, Berlin and Munich, Fed. Rep. of Germany

[21] Appl. No.: 698,332

[22] Filed: May 6, 1991

Related U.S. Application Data

[63] Continuation of Ser. No. 392,411, Aug. 11, 1989, abandoned.

[30] Foreign Application Priority Data

Sep. 20, 1988 [DE] Fed. Rep. of Germany ....... 3831941

[51] Int. Cl.$^5$ ............................................. H01L 29/40
[52] U.S. Cl. ....................................... 357/53; 357/13; 357/20; 357/34; 357/38; 357/52; 357/65
[58] Field of Search ................... 357/13, 65, 50, 52, 357/53, 20, 34, 38

[56] References Cited

U.S. PATENT DOCUMENTS

| | | | |
|---|---|---|---|
| 3,971,061 | 7/1976 | Matsushita et al. | 357/52 |
| 4,074,293 | 2/1978 | Krauitz | 357/50 |
| 4,079,403 | 3/1978 | Temple | 357/52 |
| 4,305,085 | 12/1981 | Jaecklin et al. | 357/52 |
| 4,573,066 | 2/1986 | Whight | 357/52 |
| 4,599,638 | 7/1986 | Flohrs | 357/13 |
| 4,672,738 | 6/1987 | Stengl et al. | |
| 4,682,205 | 7/1987 | Ludikhuize | 357/65 |
| 4,691,224 | 9/1987 | Takada | 357/52 |
| 4,707,719 | 11/1987 | Whight | 357/53 |
| 4,750,028 | 6/1988 | Ludikhuize | 357/52 |
| 4,774,560 | 9/1988 | Coe | 357/52 |
| 4,799,100 | 1/1989 | Blanchard et al. | 357/57 |
| 4,805,004 | 2/1989 | Gandolfi et al. | 357/52 |
| 4,903,086 | 2/1990 | Hackley | 357/53 |
| 4,907,056 | 3/1990 | Goesele et al. | 357/53 |

FOREIGN PATENT DOCUMENTS

| | | | |
|---|---|---|---|
| 60-124865 | 7/1985 | Japan | 357/52 |
| 61-135158 | 6/1986 | Japan | 357/52 |
| 7002197 | 10/1970 | Netherlands | 357/53 |
| 82/03949 | 11/1982 | PCT Int'l Appl. | 357/52 |
| 2205682 | 12/1988 | United Kingdom | 357/52 |

OTHER PUBLICATIONS

"Increased Avalanche Breakdown Voltage & Controlled Surface Electric Fields Using A Junction Termination Extension (JTE) Technique", by V. A. K. Temple, IEEE Trans. of Electron Devices, vol. ED—30, No. 8, Aug. 1983, pp. 954, 956.

"High Voltage Low on Reistance VDMOS FET", Akio Nakagawa, et al. Jap. Journal of Appl. Physics, vol. 21, (1982) Supplement 21-1, pp. 97-101.

Primary Examiner—Andrew J. James
Assistant Examiner—Sara W. Crane
Attorney, Agent, or Firm—Hill, Van Santen, Steadman & Simpson

[57] ABSTRACT

A planar pn-junction with high electric strength, which separates a semiconductor region inserted in a semiconductor body from the rest of the semiconductor body, has, in its border region, a plurality of field plates which are separated from a semiconductor zone residing below and extending the semiconductor region by an electrically insulating layer. The field plates contact the semiconductor zone in the area of contact holes. The contact holes respectively have set distances between them and the inner and outer field plate edges, whereby below those field plate parts residing between the contact holes and the inner field plates borders, local doping maxima of the semiconductor zone are provided.

3 Claims, 2 Drawing Sheets

PLANAR PN-JUNCTION OF HIGH ELECTRIC STRENGTH

This is a continuation of application Ser. No. 392,411, filed Aug. 11, 1989, now abandoned.

BACKGROUND OF THE INVENTION

The present invention relates to a planar pn-junction of high electric strength which is located parallel to a surface of a doped semiconductor body of a first conductivity type, and which separates a semiconductor region of a second conductivity type inserted in this semiconductor body from the rest of the semiconductor body. A plurality of field plates is provided in a border area of the semiconductor region which are separated from the surface via an electrically insulating layer and which contact the semiconductor body in the area of a contact hole of this layer.

A planar pn-junction of this type is disclosed in the Jap. Journal of Appl. Physics, Vol. 21 (1982) Suppl. 21.1, p. 97-101. As disclosed, the field plates contact the semiconductor body in close proximity to their inner borders, i.e. the borders facing the semiconductor region. The semiconductor body is additionally provided with a number of guard rings corresponding to the number of field plates, these guard rings being composed of ring shaped semiconductor zones having the same conductivity type as the semiconductor region limited by the pn-junction. The guard rings surround the semiconductor region at respectively increasing distances from the edge of the pn-junction. Each one of the field plates contacts a guard ring allocated to it so that they each determine the potential of the field plate. Between the semiconductor region and the innermost guard ring as well as between the individual guard rings are located subregions or zones of the weakly doped semiconductor body having a conductivity opposite to the semiconductor region, and extending to the surface containing the planar pn-junction. Together with the guard rings, the field plates cause the pn-junction to have a high breakdown voltage in its planar border region upon the application of a blocking voltage. This voltage is fed via two electrodes contacting the semiconductor region and the semiconductor body, respectively. This breakdown voltage approximately corresponds to its volume breakdown voltage which is defined as the voltage level at which the pn-junction breaks down in its part which is parallel to the surface of the semiconductor body, i.e. in the volume of the semiconductor body.

A disadvantage of this prior art pn-structure is that the field plates and the guard rings, which are necessary for achieving a high breakdown voltage, require a relatively large portion of the semiconductor area bordering the edge of the pn-junction.

SUMMARY OF THE INVENTION

It is an object of the present invention to provide a planar pn-junction, which can be realized for a desired high breakdown voltage on a considerably smaller semiconductor surface than the prior art pn-junction. According to the present invention this is achieved by a design in which at least in the case of some of the field plates, with the exception of the innermost and the outermost field plates, the arrangement of the contact holes is selected such that they are at a distance from the inner field plate border that corresponds, falls below or over their distance to the outer field plate border. The lower or upper deviation is only so large that the contact holes still have a set distance from the inner and the outer field plate border. The semiconductor region is extended in a lateral direction by a semiconductor zone of the second conductivity type with a planar termination of the edges residing below the field plates. The doping degree of this semiconductor zone is considerably smaller than the semiconductor region. The doping degree of the semiconductor zone varies in its size in the lateral direction, whereby it has local maxima respectively below the field plate parts residing between the contact holes and the inner borders of the appertaining field plates.

In a further embodiment an additional electrically insulating layer is composed of several partial layers which are provided within several recesses of the semiconductor zone at the surface, and respectively a ridge of the semiconductor zone extends, from between two such adjacent recesses to the surface. which serves for the contacting of a field plate that is attached on the partial layers located in the two adjacent recesses. The edges of the partial layers bordering the ridge, those partial layers being provided in the adjacent recesses, limit the contact hole allocated to the field plate between them. Furthermore, the distances from the contact holes to the inner field plate borders of the field plates allocated to them increase with a growing distance between the field plates and the edge of the semiconductor region.

An advantage of the present invention is that the pn-junction can be realized on a relatively small semiconductor surface, whereby, however, for its planar border region, a high value of the breakdown voltage can be achieved which approximately corresponds to the volume breakdown voltage. Furthermore, the value of the breakdown voltage in the border region depends on the value of the doping concentration of the semiconductor body, since the field plates are respectively overlapping parts of the semiconductor zone extending the semiconductor region in a lateral direction, those parts being of the same conductivity type as the semiconductor region. By contrast, the field plates of the above cited prior ar pn-junction are covering partial zones of the semiconductor body, which are weakly doped and which are of a conductivity type opposite to the semiconductor region.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
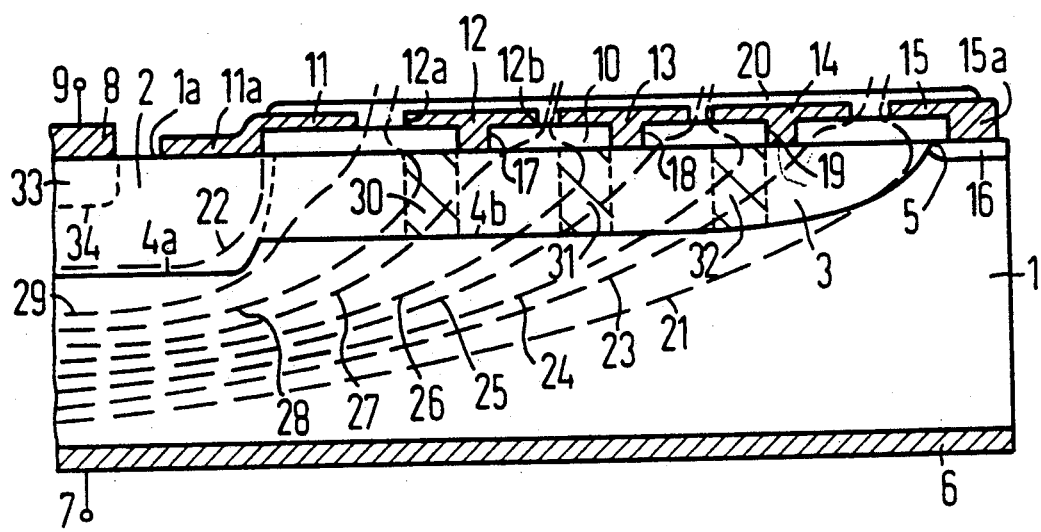
FIG. 1 is a cross-sectional view through the border region of a planar pn-junction according to the present invention.

In FIG. 1, a semiconductor body 1 is illustrated, which is, for example, composed of n-doped silicon with a doping concentration of $10^{14} cm^{-3}$, into which a p-conductive semiconductor region 2 is inserted. The semiconductor region 2 has an approximate doping concentration of $10^{18} cm^{-3}$ at the surface of the semiconductor body. The semiconductor region 2 is extended, in a lateral direction, by a p-doped semiconductor zone 3, whose doping concentration is, for example, $10^{16} cm^{-3}$ and thus considerably lower than the one of the semiconductor region 2. The semiconductor region 2 and the semiconductor zone 3 are separated from the rest of the semiconductor body 1 by a pn-junction 4a, 4b. While the part 4a of the pn-junction basically proceeds parallel to the surface 1a of the semiconductor body 1, the part 4b, with an increasing distance from the edge of the semiconductor region 2, gradually approaches the surface 1a, and reaches this surface 1a at border 5. The p-conductive region 2 and zone 3 and the n-conductive part of the semiconductor body 1 residing below the pn-junction 4a, 4b, represent, for example, a semiconductor diode, whereby the semiconductor body 1 at its bottom side, is provided with an electrode 6 corresponding to an anode side, this electrode 6 having an anode terminal 7. The region 2 as well as the semiconductor zone 3 connected therewith are contacted by an electrode 8 at a cathode side, this electrode 8 being connected to a cathode terminal 9.

Expediently, the semiconductor zone 3 can be manufactured according to a method which is described in greater detail in European reference EP A - 176 778 (corresponding to U.S. Ser. No. 776,161, now U.S. Pat. No. 4,672,738, hereby incorporated by reference). A different method for manufacturing this semiconductor zone is disclosed in the IEEE Transactions on Electron Devices, ED-30 (1983), p. 954.

Above the semiconductor zone 3, on the surface 1a, an electrically insulating layer 10 is applied, which, for example, has a layer thickness of 10 μm. On the layer 10, field plates 11 to 15 composed of electrically conductive material, for example, Al or highly-doped polycrystalline silicon, are located, of which that characterized by 11, an innermost field plate, lies directly in the border region of the semiconductor region 2 and contacts it with its inner plate border 11a. The field plates 12, 13, 14 and 15, in this sequence, are at respectively increasing distances from the semiconductor region 2, whereby the outermost field plate 15, with its right outer plate border 15a contacts the semiconductor body 1 outside of the border 5 of the pn-junction 4a, 4b. Expediently, an n-conductive contact zone 16 is inserted in the semiconductor body 1 which has, for example, a doping concentration of $10^{18} cm^{-3}$, and which, originating from that part of the surface 1a residing outside of the boundary 5 of the pn-junction 4a, 4b, slightly extends into the semiconductor body. The field plate 15 then contacts the contact zone 16. The field plates 12, 13 and 14 are contacting the p-conductive semiconductor zone 3 in the area of contact holes 17, 18 and 19, respectively. The contact hole 17 is arranged such that it is at equal distances from the inner plate border 12a and the outer plate border 12b of the field plate 12. The contact holes 18 and 19 are also arranged such that they are at respectively the same distances from the inner and outer borders of the field plates 13 and 14 allocated to them. The field plates 11 to 15 are respectively arranged closely next to each other so that they only leave narrow gaps between them which are, for example, 10 μm. The entire field plate arrangement 11 to 15 can be covered by an insulating layer 20. It is composed of amorphous silicon or caoutchouc, for example.

If a voltage U of a sufficient magnitude is applied at the terminal 7 while the terminal 9 is at ground potential, a space charge region builds up at the pn-junction 4a, 4b biased in a non-conducting direction, the bottom edge of this space charge region being indicated by the dashed line 2 and the top edge by the dashed line 22 residing within the region 2. The dashed line 2 represents an equipotential line at the same time, which corresponds to the voltage U, whereas line 22 represents an equipotential line corresponding to the ground potential. Dashed lines 23 to 29 located between 21 and 22 respectively represent further equipotential lines for intermediate voltage values graded relative to one another, whereby line 23, for example, characterizes a potential value only slightly differing from voltage U and the points lying on the line 29 have a potential only slightly differing from the ground potential. As illustrated in FIG. 1, the equipotential lines 29 and 28 are proceeding through the gap between the field plates 11 and 12, the equipotential lines 27 and 26 through the gap between 12 and 13, etc. In order to change the actual strongly curved course of the equipotential line 28 into a more straight-lined course in the proximity of the surface 1a, the semiconductor zone 3, below the part of the field plate 12 extending from the contact hole 17 to the left plate border 12a, is provided with a local doping maximum, which is indicated by a cross-hatched area 30. The course of the equipotential line 26 is straightened in an analogous manner by a further local doping maximum 31 of the semiconductor zone 3. This correspondingly applies to the equipotential line 24 whose course is influenced by a local doping maximum 32 of the semiconductor zone 3.

The course of the equipotential lines 21 to 29 shows that even for high values of the voltage U at the surface 1a in areas of the pn-junction 4b, which lie between the contact holes, for example 17, and the left field plate borders, for example 12a, the field does not become so large that the risk of a breakdown in the silicon exists. The present invention structure distinguishes itself in that the lateral voltage drop in the area between the surface 1a and the pn-junction 4b takes place evenly and, accordingly, a relatively even field distribution prevails even within the space charge zone 21, 22 in the proximity of the surface 1a, although the field plate borders, for example 12a, arranged left of the allocated contact holes, for example 17, would actually cause disturbances for the uniform field distribution. However, these disturbances are largely compensated for by the doping maxima, for example 30, of the semiconductor zone 3. The lateral maxima of the doping concentration which are present approximately within the cross-hatched areas 31, 31, 32 o the semiconductor zone 3 can be higher, for example by a factor of ten, than the values of the doping concentration in the parts of the zone 3 bordering thereto. The large-area covering of the border region of the pn-junction 4a, 4b by the field plates 11 to 15, which only leave narrow gaps between them, has the effect that a high breakdown voltage that can be achieved with the structure of the present invention is not reduced by the influence of, for example, aqueous material which is used for the passivation.

The pn-structure according to FIG. 1, is also of importance for vertical bipolar power transistors. Such a transistor is formed if a n-conductive semiconductor region 33 is inserted into the p-semiconductor region 2 such that it is separated from the p-semiconductor region 2 by a further pn-junction 34. The emitter region is then characterized by element 33, the base region by elements 2 and 3, and the collector region of the transistor by element 1. The electrodes 6 and 8 represent for the collector and emitter electrodes 7 and 9 the collector and emitter terminal. The base region 2 is provided with a base electrode which is not illustrated and which has a terminal for a base circuit. The high breakdown voltage that can be achieved with the present invention at the base-collector-junction 4a, 4b provides a high electric capability for this transistor.

Figure 2:
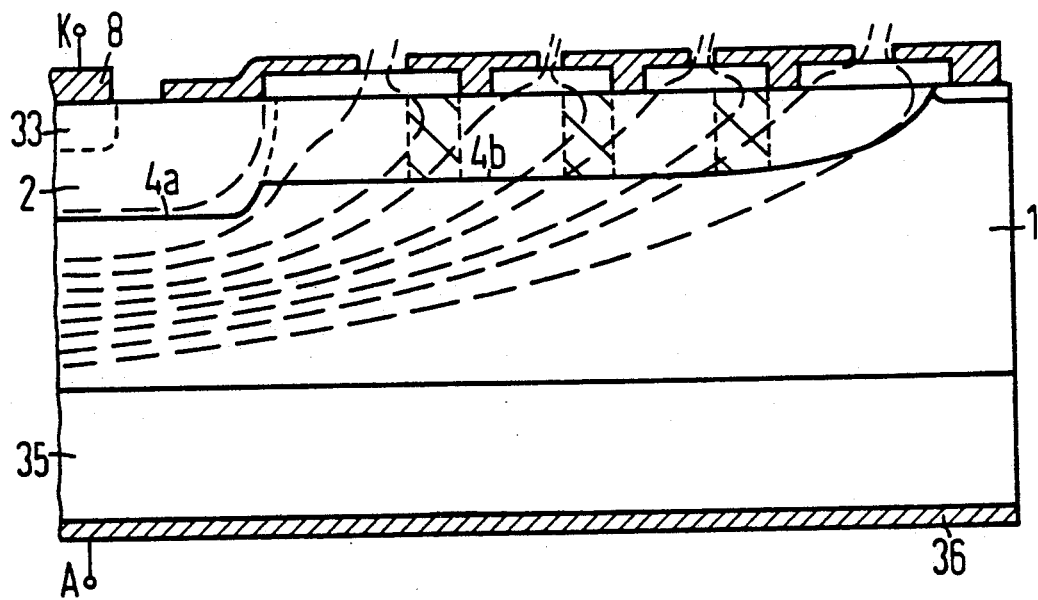
FIG. 2 is a cross-sectional view through the border region of a planar pn-junction according to the present invention between a p-base and an n-base of a thyristor.

FIG. 2 shows the application of the pn-junction according to FIG. 1 to a thyristor. The region 33 represents the n-emitter, the region 2 including the zone 3 represents the p-base, the part of the semiconductor body 1 residing below 4a and 4b represents the n-base, and an additional, p-doped semiconductor layer 35 at the bottom side of the semiconductor body 1 represents the p-emitter of the thyristor. The electrode 8 is the electrode at the side of the cathode, and an electrode 36 contacting the area 35 is the electrode of the thyristor at the side of the anode. The electrodes 8 and 36 are connected to terminals K and A. An electrode which is not illustrated and which contacts the region 2 is the gate electrode of the thyristor which is charged with ignition or discharge signals for the igniting and/or discharging of the thyristor.

Figure 3:
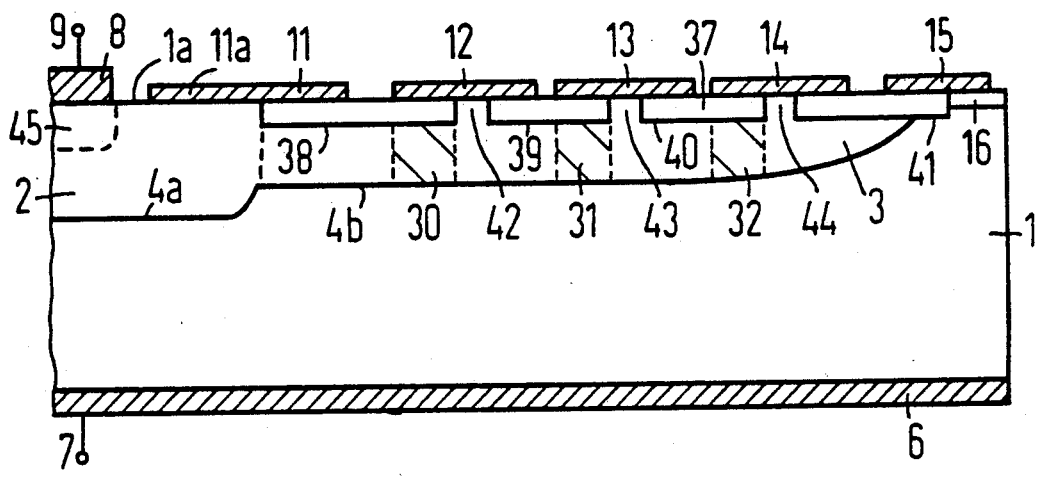
FIG. 3 is a cross-sectional view through the border region of a different planar pn-junction according to the present invention.

FIG. 3 shows an alternative, structural embodiment of the arrangement according to FIG. 1. The structural parts already described in connection with FIG. 1 are provided with the same reference numerals. In contrast to FIG. 1, an electrically insulating area/layer 37 is formed, after etching recesses 38 to 41 out of the semiconductor zone 3, or respectively, the semiconductor body 1. The ridge or web-shaped parts 42 to 44 of the semiconductor zone 3, remaining between the recesses 38 to 41, are contacted by the field plates 12 to 14 which are applied to the insulating layer/area 37. The field plates 11 and 15 corresponding to FIG. 1 contact the semiconductor region 2 and the region 16. The equipotential lines (not shown) within the space charge region building up at the pn-junction 4a, 4b upon the application of a blocking voltage corresponds to the illustration according to FIG. 1. If an n-conductive region 45 is inserted in the region 2, the structure according to FIG. 3 is also of importance for bipolar transistors, and, if applied correctly to FIG. 2, for thyristors as well.

Figure 4:
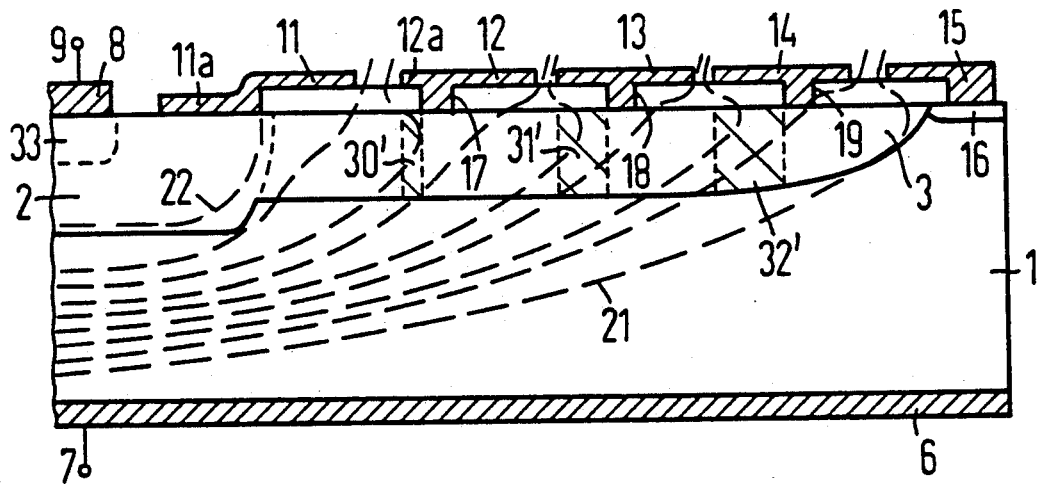
FIG. 4 is a cross-sectional view depicting an alternative embodiment of the FIG. 1 embodiment.

FIG. 4 shows an exemplary embodiment of the present invention, whereby the distance from the contact holes, for example 17, to the field plate borders, for example 12a, is not constant, but varies from field plate to field plate. In detail, the innermost and the outermost field plates 11 or 15 are fashioned in the same manner as in FIG. 1, whereas the distances between the contact holes of the field plates 12 to 14 and the respectively left plate borders increase from a relatively small value at the field plate 12 to a relatively high value at the field plate 14. However, the contact hole 17 is at a set distance from the left plate border 12a, as well as the contact hole 19 from the right plate border of the field plate 14. Corresponding to the different lengths of the plate parts respectively located left of the allocated contact holes, the areas of the local doping maxima 30', 31' and 32' in the p-doped semiconductor zone have different widths. The equipotential lines 21, 22 and the intermediate equipotential lines have approximately the same course as in FIG. 1. The structure according to FIG. 4 can particularly have a smaller penetration depth of the semiconductor zone 3 than the structure according to FIG. 1.

The illustrated exemplary embodiments of the pn-junction according to the present invention are preferrably realized on dynamically balanced semiconductor bodies, i.e. semiconductor disks with circular, lateral limitations. The parts 2, 3, 33 and 45 also have circular lateral limitations, whereas the field plates 11 to 15 have the shape of circular rings.

Apart from the embodiments described so far, such embodiments belong to the present invention, wherein the cited semiconductor regions are respectively replaced by the opposite conductivity type, and instead of the cited voltage U, a voltage of the opposite polarity is applied.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A planar pn-junction of high electric strength arranged in a surface of a doped semiconductor body of a first conductivity type, and which separates a semiconductor region of a second conductivity type inserted in the semiconductor body from the rest of the semiconductor body, whereby a plurality of field plates, including an innermost field plate and an outermost field plate, is provided in a border area of the semiconductor region which are separated from the semiconductor body via an electrically insulating layer, and which contact the semiconductor body respectively in the area of a contact hole of the insulating layer, each of said field plates having an inner field plate border and an outer field plate border, comprising, at least for one of the field plates, with the exception of the innermost and outermost field plates, the arrangement of the contact hole being selected such that it is at a first distance from the inner field plate border that corresponds, falls below or over its second distance to the outer field plate border, a difference between the first and second distances being only so large that the contact hole still has a set distance from the inner and the outer field plate borders, the semiconductor region being adjacent a semiconductor zone of the second conductivity type with a planar termination residing below the field plates, the doping concentration of the semiconductor zone being considerably smaller than the semiconductor region, and the doping concentration of the semiconductor zone varying in a lateral direction, whereby the semiconductor zone has local maximas respectively below the field plate parts residing between the contact hole and the inner field plate borders of field plate associated with the contact hole.

2. The planar pn-junction according to claim 1, wherein said electrically insulating layer is composed of several partial layers which are provided within recesses of the semiconductor zone at a surface thereof, wherein respectively between two such adjacent recesses a ridge of the semiconductor zone extends to the surface, which serves for the contacting of a field plate that is on the partial layers located in the two adjacent recesses, and wherein edges of the partial layers bordering the ridge limit the contact hole allocated to this field plate.

3. The planar pn-junction according to claim 1, wherein a plurality of contact holes are provided and wherein the first distances from the contact holes to the associated inner field plate borders of the field plates increase with distance between the field plates and an edge of the semiconductor region.

* * * * *